US010147622B2

(12) United States Patent
Wu et al.

(10) Patent No.: US 10,147,622 B2
(45) Date of Patent: Dec. 4, 2018

(54) ELECTRIC-PROGRAMMABLE MAGNETIC MODULE

(71) Applicants: Industrial Technology Research Institute, Hsinchu (TW); PlayNitride Inc., Tainan (TW)

(72) Inventors: Ming-Hsien Wu, Tainan (TW); Yen-Hsiang Fang, New Taipei (TW); Chia-Hsin Chao, Hsinchu County (TW)

(73) Assignees: Industrial Technology Research Institute, Hsinchu (TW); PlayNitride Inc., Tainan (TW)

( * ) Notice: Subject to any disclaimer, the term of this patent is extended or adjusted under 35 U.S.C. 154(b) by 0 days.

(21) Appl. No.: 15/428,156

(22) Filed: Feb. 9, 2017

(65) Prior Publication Data

US 2017/0148650 A1    May 25, 2017

Related U.S. Application Data

(62) Division of application No. 14/954,993, filed on Nov. 30, 2015, now Pat. No. 9,607,907.

(30) Foreign Application Priority Data

Dec. 12, 2014  (TW) .............................. 103143505 A
Jun. 30, 2015  (TW) ............................. 104121139 A

(51) Int. Cl.
  *H01L 21/67*   (2006.01)
  *H01L 21/683*  (2006.01)
  (Continued)

(52) U.S. Cl.
  CPC .... *H01L 21/67144* (2013.01); *G01R 31/2635* (2013.01); *H01L 21/6835* (2013.01);
  (Continued)

(58) Field of Classification Search
  CPC ......... H01L 22/22; H01L 33/06; H01L 33/62; H01L 33/0095; H01L 33/12; H01L 21/67144; H01L 21/6835
  See application file for complete search history.

(56) References Cited

U.S. PATENT DOCUMENTS 6,355,491 B1   3/2002  Zhou et al.
7,205,214 B2   4/2007  Hayashi et al.
(Continued)

FOREIGN PATENT DOCUMENTS

CN    102903804    1/2013
CN    103053092    4/2013
(Continued)

OTHER PUBLICATIONS

Kim et al., "Generation of Local Magnetic Field by Nano Electra-Magnets," Japanese Journal of Applied Physics, Apr. 2004, pp. 2054-2056.
(Continued)

*Primary Examiner* — Kenneth Parker
*Assistant Examiner* — Long H Le
(74) *Attorney, Agent, or Firm* — JCIPRNET

(57) ABSTRACT

An electric-programmable magnetic module comprising a micro electro mechanical system (MEMS) chip and a bonding equipment is provided. The MEMS chip comprises a plurality of electromagnetic coils and each of the electromagnetic coils is individually controlled. The MEMS chip is assembled with and carried by the bonding equipment.

7 Claims, 19 Drawing Sheets

Related U.S. Application Data

(60) Provisional application No. 62/085,657, filed on Dec. 1, 2014.

(51) Int. Cl.
| | | |
|---|---|---|
| *H01L 33/62* | (2010.01) | |
| *H01L 33/00* | (2010.01) | |
| *H01L 21/66* | (2006.01) | |
| *H01L 23/00* | (2006.01) | |
| *G01R 31/26* | (2014.01) | |
| *H01L 33/06* | (2010.01) | |
| *H01L 33/12* | (2010.01) | |

(52) U.S. Cl.
CPC .............. *H01L 22/20* (2013.01); *H01L 22/22* (2013.01); *H01L 24/75* (2013.01); *H01L 24/81* (2013.01); *H01L 33/0095* (2013.01); *H01L 33/62* (2013.01); *H01L 33/06* (2013.01); *H01L 33/12* (2013.01); *H01L 2221/6835* (2013.01); *H01L 2221/68368* (2013.01); *H01L 2933/0066* (2013.01)

(56) References Cited

U.S. PATENT DOCUMENTS

| | | |
|---|---|---|
| 8,333,860 B1 | 12/2012 | Bibl et al. |
| 8,349,116 B1 | 1/2013 | Bibl et al. |
| 8,415,771 B1 | 4/2013 | Golda et al. |
| 8,518,204 B2 | 8/2013 | Hu et al. |
| 8,558,243 B2 | 10/2013 | Bibl et al. |
| 8,646,505 B2 | 2/2014 | Bibl et al. |
| 8,789,573 B2 | 7/2014 | Bibl et al. |
| 8,794,501 B2 | 8/2014 | Bibl et al. |
| 8,933,433 B2 | 1/2015 | Higginson et al. |
| 8,945,968 B2 | 2/2015 | Bibl et al. |
| 2005/0093666 A1* | 5/2005 | Miyajima ............... G03F 7/707 335/285 |
| 2005/0233546 A1 | 10/2005 | Oohata et al. |
| 2011/0151602 A1 | 6/2011 | Speier |
| 2012/0299147 A1 | 11/2012 | Mitani |
| 2013/0126827 A1 | 5/2013 | Bibl et al. |
| 2013/0128585 A1 | 5/2013 | Bibl et al. |
| 2013/0130440 A1 | 5/2013 | Hu et al. |
| 2014/0094878 A1 | 4/2014 | Gossler et al. |
| 2014/0217533 A1* | 8/2014 | Pagani ............... G01R 33/0005 257/427 |
| 2014/0290867 A1 | 10/2014 | Bibl et al. |
| 2014/0340900 A1 | 11/2014 | Bathurst et al. |
| 2015/0349200 A1 | 12/2015 | Chen et al. |
| 2015/0355294 A1* | 12/2015 | Honkura ............ G01R 33/0023 324/252 |
| 2017/0031152 A1* | 2/2017 | Khechana ............... B81C 3/005 |

FOREIGN PATENT DOCUMENTS

| | | |
|---|---|---|
| CN | 104115266 | 10/2014 |
| CN | 105129259 | 12/2015 |
| TW | 201327721 | 7/2013 |

OTHER PUBLICATIONS

Zheng et al., "A BiaMEMS chip with integrated micro electromagnet array towards bio-particles manipulation," Microelectronic Engineering, Jun. 2014, pp. 1-6.

Pal et al., "High temperature ferromagnetism and optical properties of Co doped ZnO nanoparticles," Journal of Applied Physics, Oct. 2010, pp. 084322.

Ahn et al., "Omnidirectional Printing of Flexible, Stretchable, and Spanning Silver Microelectrodes," Science, Mar. 2009, pp. 1590-1593.

Park et al., "Printed Assemblies of Inorganic Light-Emitting Diodes for Deformable and Semitransparent Displays," Science, Aug. 2009, pp. 977-981.

Office Action of China Counterpart Application, dated Aug. 15, 2018, pp. 1-7.

* cited by examiner

ELECTRIC-PROGRAMMABLE MAGNETIC MODULE

CROSS-REFERENCE TO RELATED APPLICATION

This application is a divisional application of U.S. application Ser. No. 14/954,993, filed on Nov. 30, 2015. The prior U.S. application claims the priority benefits of U.S. provisional application Ser. No. 62/085,657, filed on Dec. 1, 2014, Taiwan application serial no. 103143505, filed on Dec. 12, 2014, and Taiwan application serial no. 104121139, filed on Jun. 30, 2015. The entirety of each of the above-mentioned patent applications is hereby incorporated by reference herein and made a part of this specification.

BACKGROUND OF THE DISCLOSURE

Technical Field

The present disclosure generally relates to a picking-up and placement module for electronic devices, in particular, to an electric-programmable magnetic module.

Description of Related Art

Inorganic light emitting diodes (LEDs) have features of self-luminous, high brightness and so on, and therefore have been widely applied in the fields of illumination, display, projector and so forth. Taking monolithic full color micro-LED displays as an example, monolithic micro-displays have been widely used in projector and faced with a bottleneck of colorizing technology. Generally, in order to obtain different colored lights, epitaxial processes for fabricating a single LED chip including a plurality of light emitting layers capable of emitting different colored lights has already been proposed. In this case, the single LED chip can provide different colored lights. Since lattice constants of the light emitting layers capable of emitting different colored lights are different, growth of the light emitting layers on a same substrate is difficult to be achieved. Accordingly, another solution has been proposed. In order to obtain different colored lights, at least one LED chip capable of emitting light with short wavelength and a plurality of wavelength conversion materials are used, wherein the wavelength conversion materials are capable of being excited by the light emitted from the LED chip and generate excited light having different color. However, the conversion efficiency of the wavelength conversion materials is low and it is difficult to coat the wavelength conversion materials uniformly.

The picking-up and placement technique for LED chips has a better chance to enhance brightness and display quality of a monolithic micro-display significantly. To one ordinary skilled in the art, how to efficiently pick-up and place the LED chips to a circuit substrate of the monolithic micro-display is an important issue.

SUMMARY OF THE DISCLOSURE

One of exemplary embodiments provides an electric-programmable magnetic module.

One of exemplary embodiments provides an electric-programmable magnetic module comprising a micro electro mechanical system (MEMS) chip and a bonding equipment is provided. The MEMS chip comprises a plurality of electromagnetic coils and each of the electromagnetic coils is individually controlled. The MEMS chip is assembled with and carried by the bonding equipment.

Several exemplary embodiments accompanied with drawings are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 4A' schematically illustrates conductive films of electromagnetic coils.

DESCRIPTION OF THE EMBODIMENTS

Figure 1:
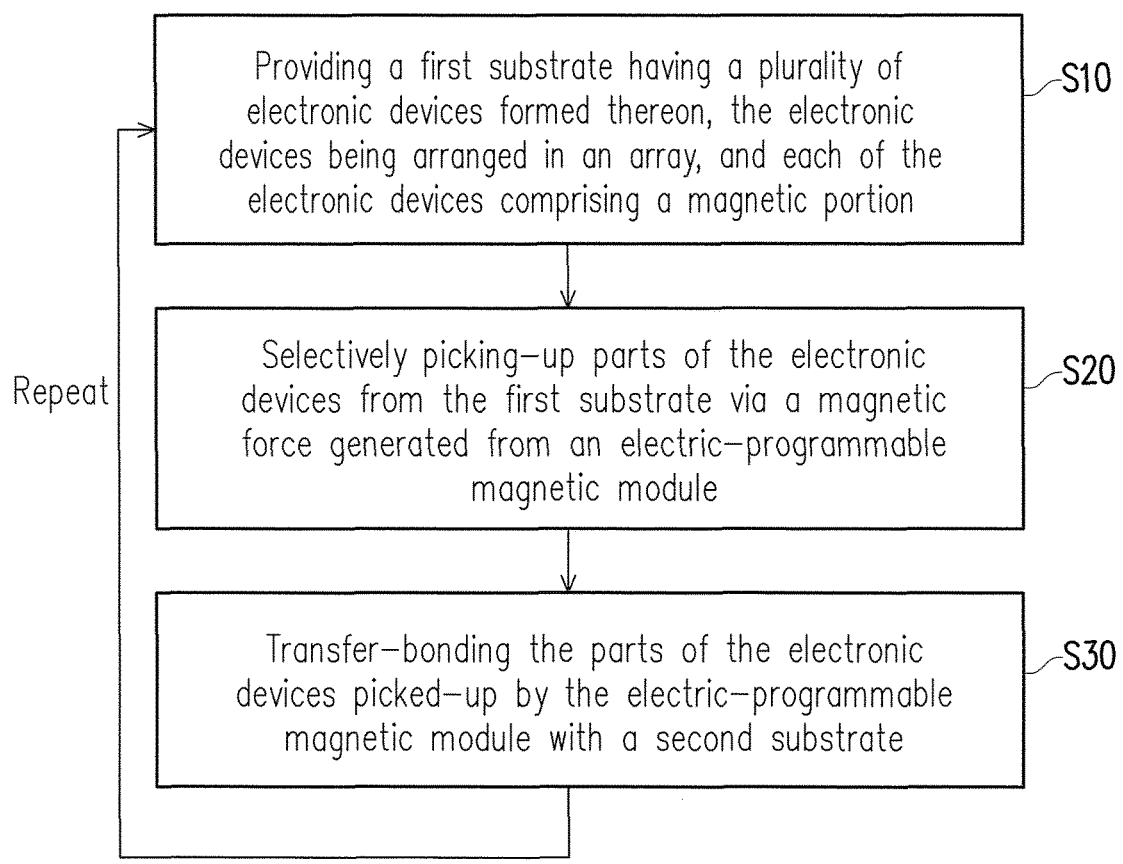
FIG. 1 is a flowchart schematically illustrates a picking-up and placement process for electronic devices in accordance with this disclosure.

Reference will now be made in detail to the present preferred embodiments of the disclosure, examples of which are illustrated in the accompanying drawings. Wherever possible, the same reference numbers are used in the drawings and the description to refer to the same or like parts.

First Embodiment

FIG. 1 is a flowchart schematically illustrates a picking-up and placement process for electronic devices in accordance with this disclosure. Referring to FIG. 1, the picking-up and placement process for electronic devices comprises the following steps (S10, S20 and S30). First of all, a first substrate having a plurality of electronic devices formed thereon is provided, wherein the electronic devices are arranged in an array and each of the electronic devices comprises a magnetic portion formed thereon or embedded therein (Step S10). After the first substrate is provided, parts of the electronic devices are selectively picked-up from the first substrate via a magnetic force generated from an electric-programmable magnetic module (Step S20). Then, the parts of the electronic devices picked-up by the electric-programmable magnetic module are bonded with a second substrate (Step S30). In one of exemplary embodiments of this disclosure, the picking-up and placement process for electronic devices of this embodiment may further comprise repeating the aforesaid steps (S10 through S30) at least one time so that the electronic devices formed on first substrates can be placed on and bonded with the second substrate. For example, the electronic devices formed on first substrates are capable of emitting different colored lights. In this embodiment, the electronic devices are photoelectric devices (e.g.

light-emitting diodes, photo-detectors, solar cells and so on) or other electric devices irrelevant to light (e.g. sensors, transistors and so on).

Figure 2A:
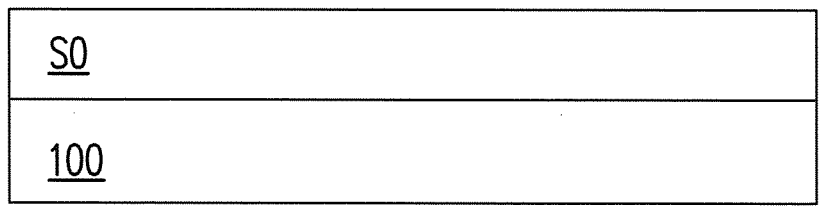
FIG. 2A through FIG. 2N are cross-sectional views of a picking-up and placement process for electronic devices in accordance with the first embodiment of this disclosure.
Figure 2B:
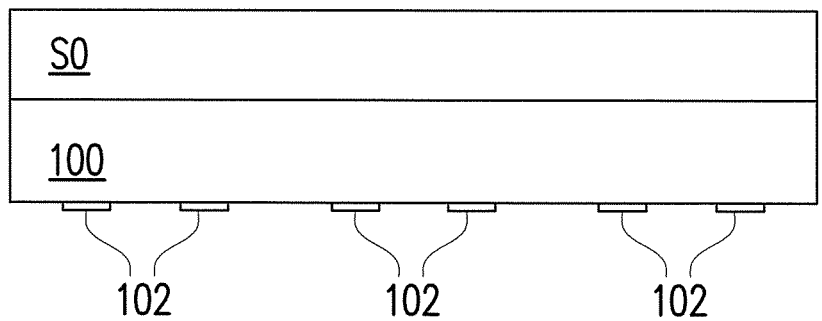
FIG. 2J', FIG. 2J" and FIG. 2J'" schematically illustrate top views of different supporting layers.
Figure 2C:
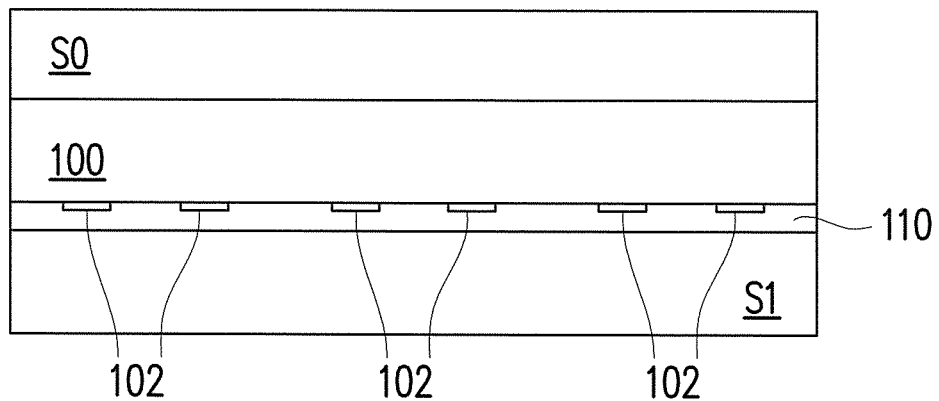
Figure 2D:
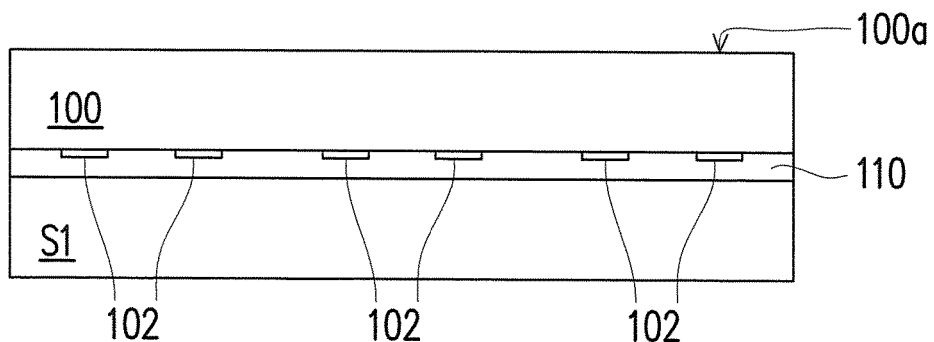
Figure 2E:
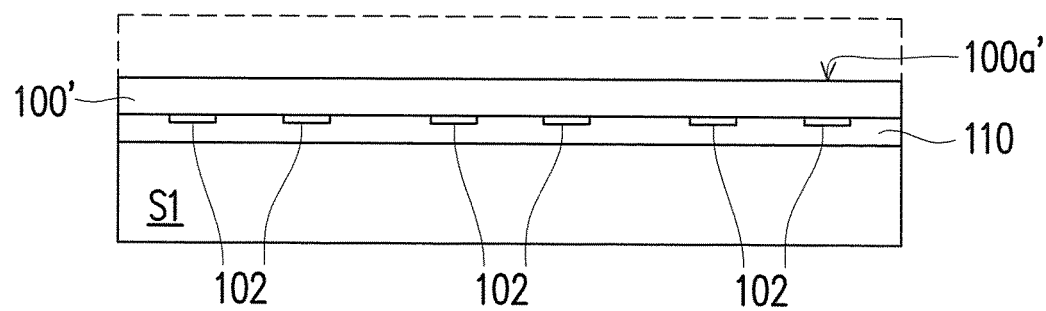
Figure 2F:
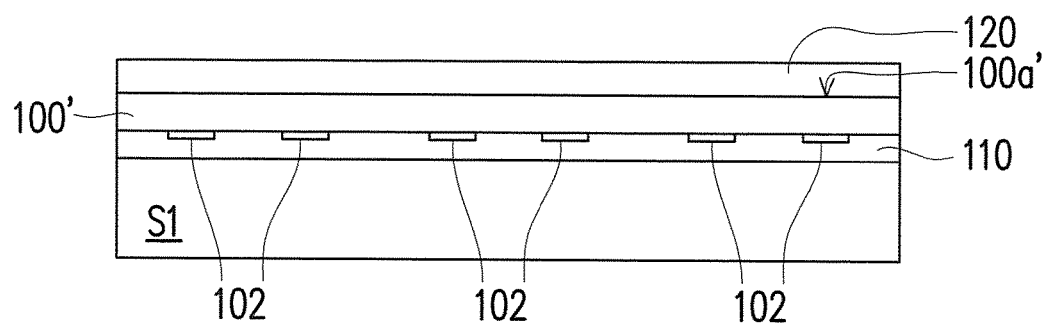
Figure 2G:
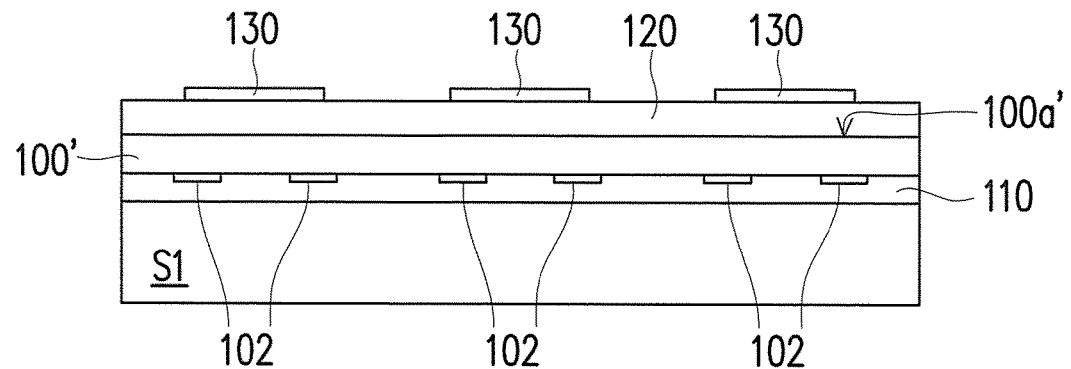
Figure 2H:
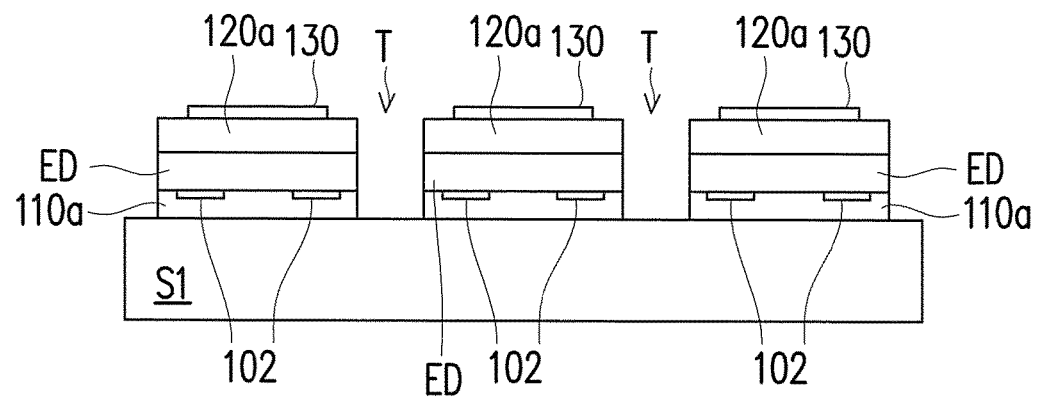
Figure 2I:
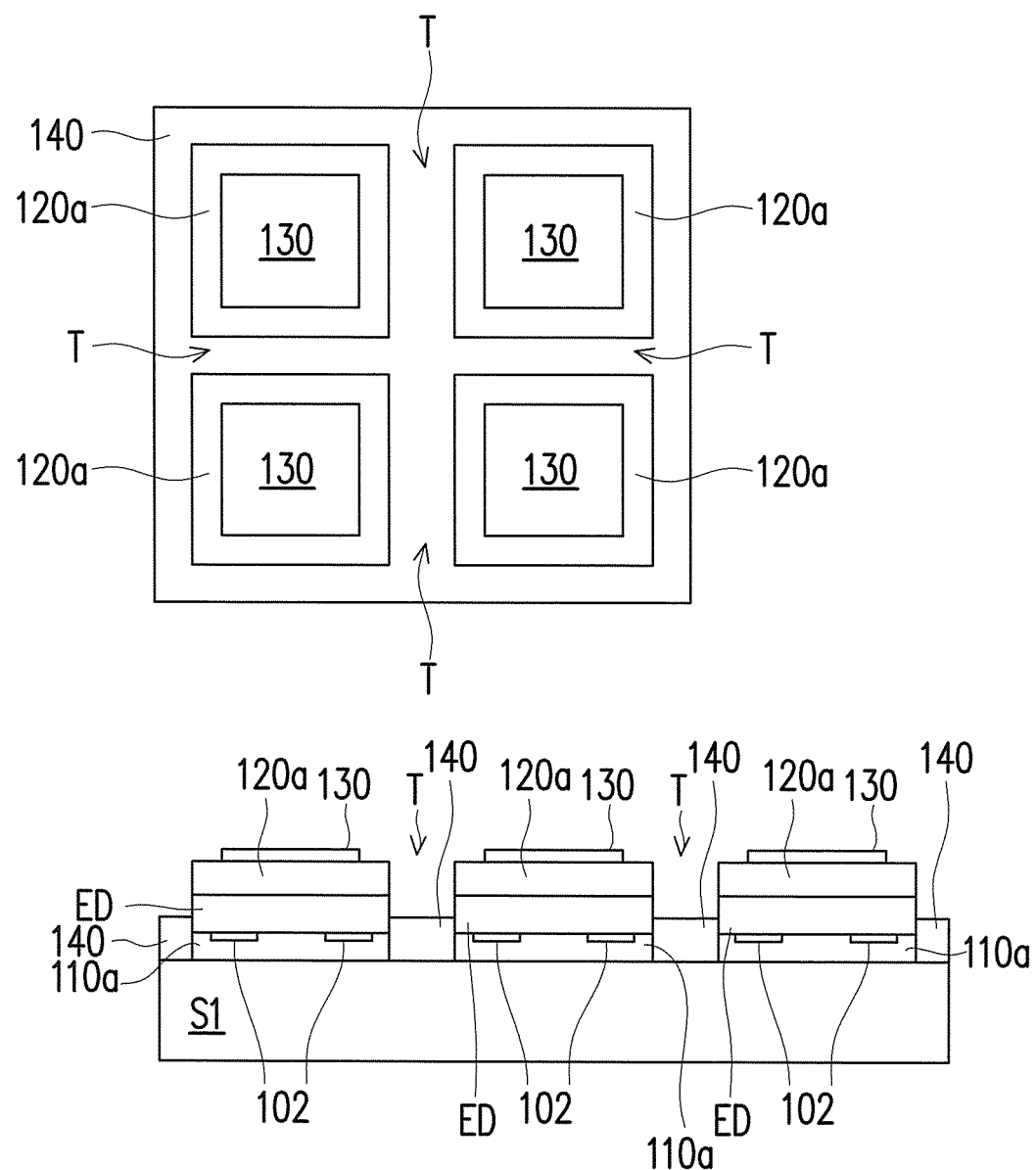
Figure 2J:
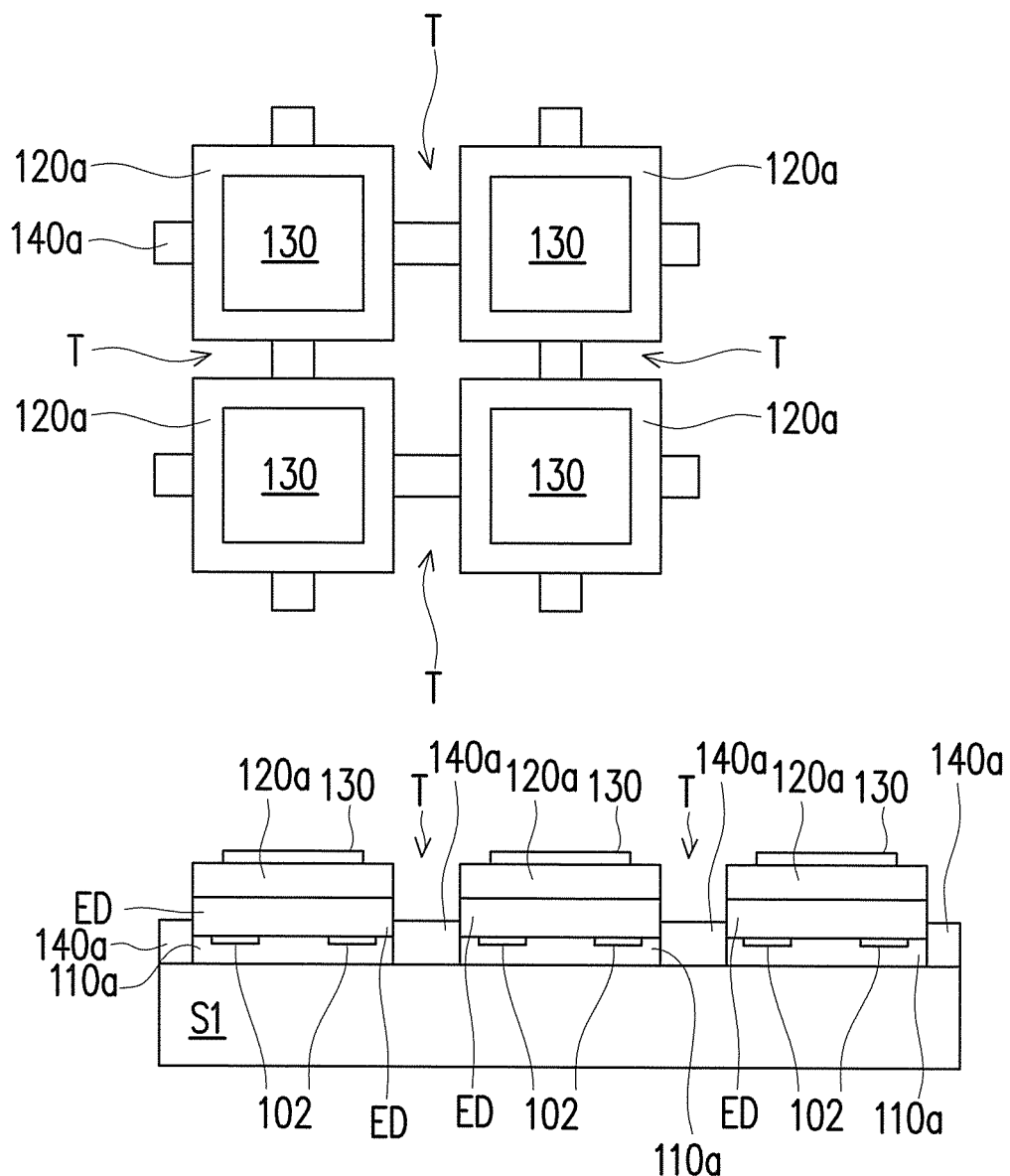
Figure 2J:
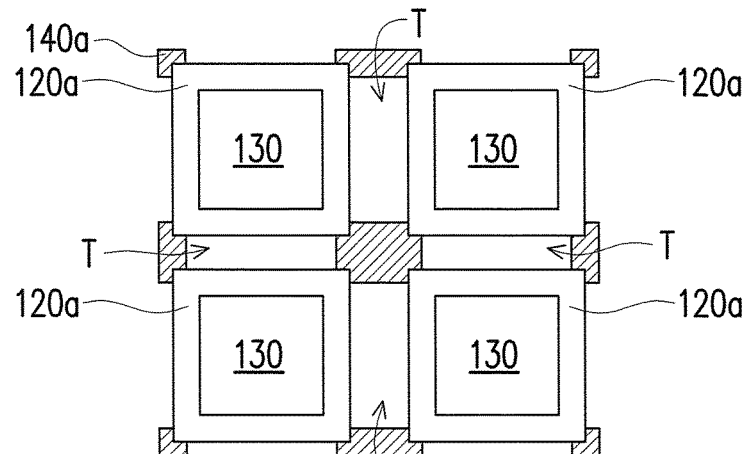
Figure 2J:
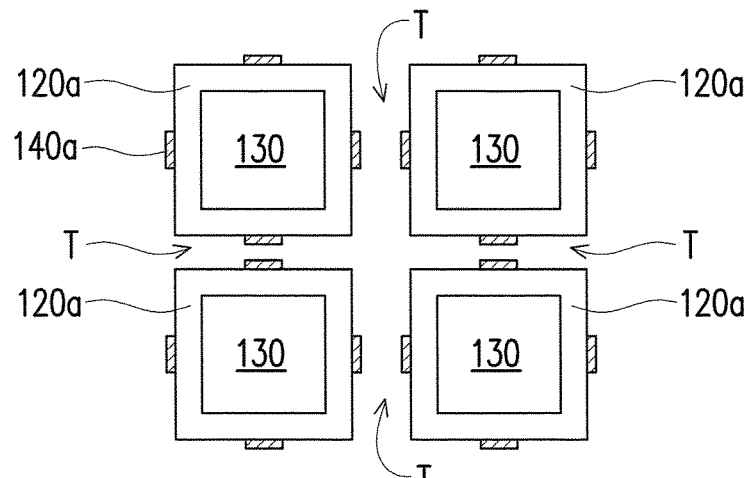
Figure 2J:
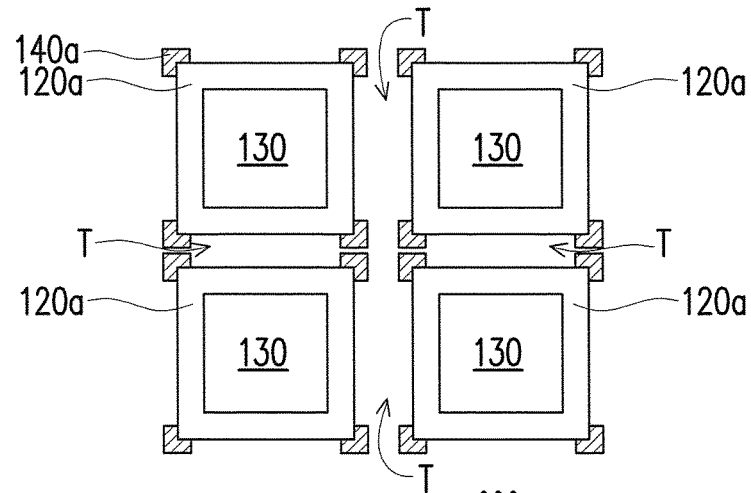
Figure 2K:
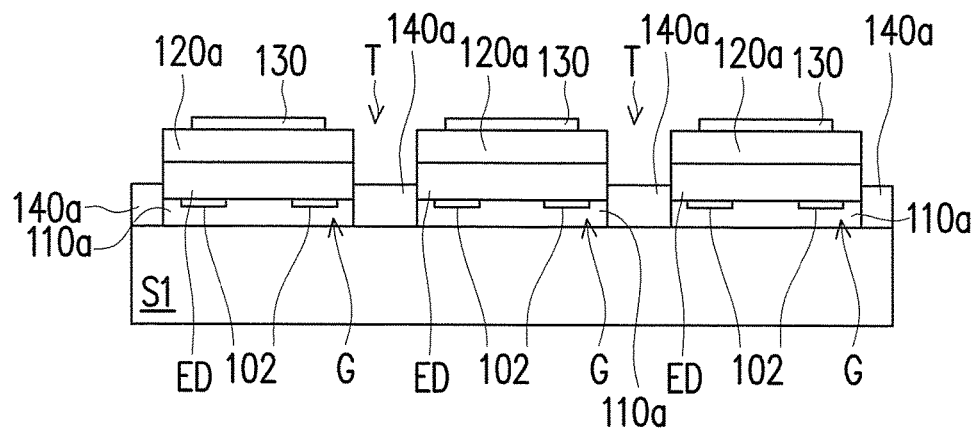
Figure 2L:
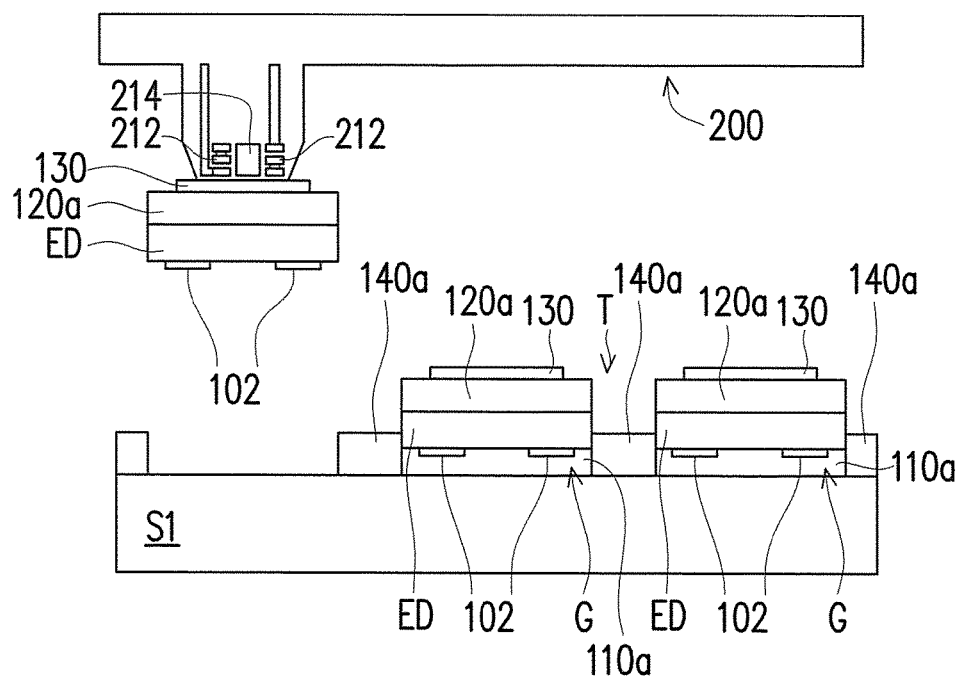
Figure 2M:
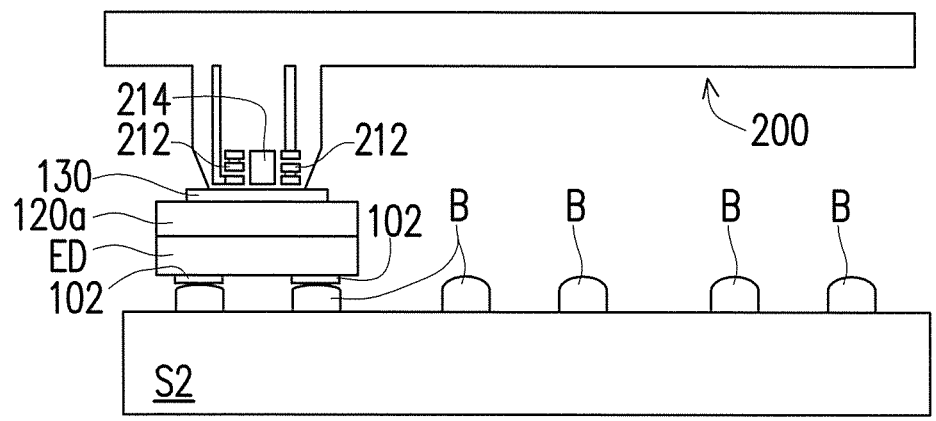
Figure 2N:
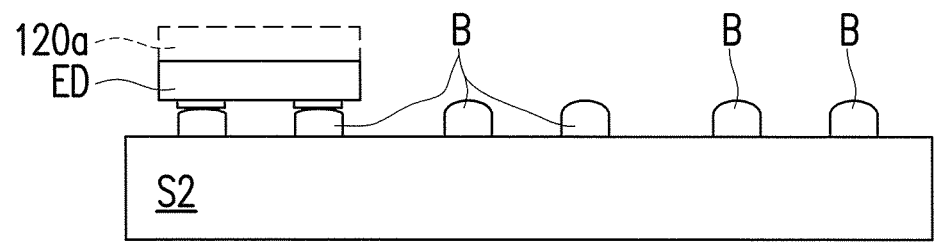

In order to further describe the first embodiment of the disclosure iii details, the first embodiment is described accompanied with FIG. 2A through FIG. 2N.

FIG. 2A through FIG. 2N are cross-sectional views of a picking-up and placement process for electronic devices in accordance with the first embodiment of this disclosure.

Referring to FIG. 2A, a growth substrate S0 is provided and a photoelectric semiconductor layer 100 is formed on the growth substrate S0. In one of exemplary embodiments of this disclosure, the growth substrate S0 is, for example, a silicon substrate, a silicon carbide (SiC) substrate, a sapphire substrate or other suitable substrate. The photoelectric semiconductor layer 100 is, for example, a light-emitting device layer, photo-sensing layer, photovoltaic device layer and so on. The photoelectric semiconductor layer 100 is, for example, formed by metal-organic chemical vapour deposition (MOCVD). In other words, the photoelectric semiconductor layer 100 may be an epitaxial layer capable of emitting light when a driving current is applied thereto. Specifically, the photoelectric semiconductor layer 100 may include an n-type doped semiconductor layer, a multiple quantum well (MQW) light-emitting layer and a p-type doped semiconductor layer, wherein the MQW light-emitting layer is sandwiched between the n-type doped semiconductor layer and the p-type doped semiconductor layer. Furthermore, in addition to the n-type doped semiconductor layer, the MQW light-emitting layer and the p-type doped semiconductor layer, the photoelectric semiconductor layer 100 may further include a buffer layer, an n-type cladding layer, a p-type cladding layer, a current blocking layer, a current spreading layer or the combinations thereof. The photoelectric semiconductor layer 100 formed on the growth substrate S0 is only for illustration, other types of semiconductor layers may also be formed on the growth substrate S0.

Referring to FIG. 2B, after the photoelectric semiconductor layer 100 is formed on the growth substrate S0, a plurality of electrodes 102 are formed on the photoelectric semiconductor layer 100. In one of exemplary embodiments of this disclosure, the electrodes 102 include a plurality of n-electrodes electrically connected to the n-type doped semiconductor layer and a plurality of p-electrode electrically connected to the p-type doped semiconductor layer.

Referring to FIG. 2C, after the electrodes 102 are formed on the photoelectric semiconductor layer 100, the photoelectric semiconductor layer 100 and the electrodes 102 are temporarily bonded with a first substrate S1 through an adhesive 110, wherein the adhesive 110 adheres with the electrodes 102 and the photoelectric semiconductor layer 100 and is sandwiched between the photoelectric semiconductor layer 100 and the first substrate S1. In one of exemplary embodiments of this disclosure, the first substrate S1 is, for example, a silicon substrate, a silicon carbide (SiC) substrate, a sapphire substrate or other suitable substrate. The material of the adhesive 110 is, for example, organic materials, organic polymers or other suitable materials with proper adhesion.

Referring to FIG. 2D, after the photoelectric semiconductor layer 100 and the electrodes 102 are temporarily bonded with the first substrate S1, the growth substrate S0 is removed to expose a surface 100a of the photoelectric semiconductor layer 100. In one of exemplary embodiments of this disclosure, the growth substrate S0 is lift-off from the surface 100a of the photoelectric semiconductor layer 100 by laser lift-off process, for example.

Referring to FIG. 2E, after the growth substrate S0 is removed, a thinning process may be optionally performed such that the thickness of the photoelectric semiconductor layer 100 can be reduced. After the thinning process is performed, the thinned photoelectric semiconductor layer 100' having a surface 100a' is formed. In one of exemplary embodiments of this disclosure, the photoelectric semiconductor layer 100 carried by the first substrate S1 may be thinned by chemical mechanical polishing (CMP) process, chemical etch process, plasma etch process or other suitable processes.

Referring to FIG. 2F, after the photoelectric semiconductor layer 100 is thinned, a sacrificial layer 120 is formed on the surface 100a' of the photoelectric semiconductor layer 100'. Specifically, the sacrificial layer 120 covers the surface 100a' of the photoelectric semiconductor layer 100'. In one of exemplary embodiments of this disclosure, the material of the sacrificial layer 120 is, for example, organic materials, organic polymers, dielectric materials, oxides and so on.

Referring to FIG. 2G, a plurality of magnetic portions 130 are formed on the sacrificial layer 120. In one of exemplary embodiments of this disclosure, the material of the magnetic portions 130 is, for example, nickel (Ni), nickel-iron alloy or other suitable ferromagnetic metals. It is noted that the magnetic portions 130 are distributed corresponding to the electrodes 102. For example, the magnetic portions 130 are separated from one another, each of the magnetic portions 130 is located above a pair of electrodes 102 (i.e. one n-electrode and one p-electrode). The thickness of each magnetic portion 130 is about 1 micro-meter. The area and the shape of each magnetic portion 130 may be designed based on actual requirements.

Referring to FIG. 2G and FIG. 2H, the photoelectric semiconductor layer 100', the adhesive 110 and the sacrificial layer 120 are patterned to form a plurality of electronic devices ED arranged in array, a plurality of sacrificial patterns 120a disposed on the electronic devices ED and a plurality of adhesion patterns 110a disposed between the electronic devices ED and the first substrate S1. The adhesion patterns 110a, sacrificial patterns 120a and the electronic devices ED constitute a plurality of stacked structures. In one of exemplary embodiments of this disclosure, the patterning process of the photoelectric semiconductor layer 100', the adhesive 110 and the sacrificial layer 120 is a photolithography and etching process, for example. As shown in FIG. 2H, the magnetic portions 130 are distributed corresponding to the sacrificial patterns 120a. For example, each of the magnetic portions 130 is disposed on one of the sacrificial patterns 120a, respectively. Each of the electronic devices ED is between one of the sacrificial patterns 120a and one of the adhesion patterns 110a, respectively. Furthermore, intersected trenches T are formed between the aforesaid stacked structures when the photoelectric semiconductor layer 100', the adhesive 110 and the sacrificial layer 120 are patterned.

Referring to FIG. 2I and FIG. 2J, lower portions of FIG. 2I and FIG. 2J are cross-sectional views and upper portions of FIG. 2I and FIG. 2J are top views. As shown in FIG. 2I and FIG. 2J, a supporting material 140 having a predetermined thickness is filled within the intersected trenches T, and the supporting material 140 is further patterned to form a supporting layer 140a. The thickness of the supporting material 140 and the supporting layer 140a is less than the depth of the trenches T. In one of exemplary embodiments of this disclosure, the patterning process of the supporting material 140 is a photolithography and etching process, for example. The patterned supporting layer 140a is formed on the first substrate S1 and located in the trenches T to support the electronic devices ED. Specifically, the supporting layer 140a physically connects the adjacent electronic devices ED, and at least a part of each adhesion pattern 110a is exposed by the supporting layer 140a. In other words, a part of sidewall of each adhesion pattern 110a and a part of the first substrate S1 are exposed by the supporting layer 140a. As shown in top view of FIG. 2J, the supporting layer 140a extends from the middle edge of one electronic device ED to the middle edge of another electronic device ED. However, the disclosure is not limited thereto. As shown in top view of FIG. 2J', the supporting layer 140a connects corners of the electronic devices ED. The supporting layer 140a is not required to connect the electronic devices ED. For example, the supporting layer 140a may include patterns separated from one another, as shown in FIG. 2J" and FIG. 2J'''.

Referring to FIG. 2K, the adhesion patterns 110a are removed so as to form a gap G between each of the electronic devices ED and the first substrate S1. Since the supporting layer 140a physically supports the electronic devices ED, the electronic devices ED are not in direct contact with the first substrate S1.

Referring to FIG. 2L, parts of the electronic devices ED are then selectively picked-up from the first substrate S1 via a magnetic force generated from an electric-programmable magnetic module 200. The electric-programmable magnetic module 200 of this disclosure is described in detail in accompanying with FIG. 3.

It is noted that the magnetic force generated from the electric-programmable magnetic module 200 is relevant to the magnetic portion 130. The magnetic force must greater than sum of the weight of the electronic device ED to be picked up and the connection force provided by the supporting layer 140a, in this way, the electronic device ED can separate from the first substrate S1 and can be picked-up by the magnetic force generated from the electric-programmable magnetic module 200.

Referring to FIG. 2M, the parts of the electronic devices ED picked-up by the electric-programmable magnetic module 200 are placed on and bonded with a second substrate S2. In one of exemplary embodiments of this disclosure, the second substrate S2 includes a plurality of conductive bumps B formed thereon, and the electronic devices ED picked-up by the electric-programmable magnetic module 200 is placed on and bonded with the second substrate S2 through the conductive bumps B. During the picking-up and placement period, a heating process is performed such that the electronic devices ED can be successfully bonded onto the second substrate S2.

Referring to FIG. 2N, the sacrificial patterns 120a on the electronic devices ED that are bonded with the second substrate S2 are removed. It is noted that before the sacrificial patterns 120a are removed, the picking-up and placement of the electronic devices ED is accomplished. Accordingly, removal of the sacrificial patterns 120a is optional.

During the electronic devices ED picked-up by the electric-programmable magnetic module 200 are bonded with the second substrate S2, an in-situ testing for the electronic devices ED is performed to inspect whether the bonding or electrical connection between the electronic devices ED and the second substrate S2 is failed. The in-situ testing is performed by the electric-programmable magnetic module 200. In an alternative embodiments, after the electronic devices ED picked-up by the electric-programmable magnetic module 200 are bonded with the second substrate S2, an in-situ testing for the electronic devices ED is performed to inspect whether the bonding or electrical connection between the electronic devices ED and the second substrate S2 is failed. When at least one failed electronic device ED is inspected by the in-situ testing, the at least one failed electronic device ED is de-bonded from the second substrate S2 and a position information of the failed electronic device ED is recorded. Then, at least one of the remaining electronic devices ED (as shown in FIG. 2K) on the first substrate Si is picked-up and bonded with the second substrate S2 by the electric-programmable magnetic module 200 according the aforesaid position information. In other words, the failed electronic device ED is replaced by a new electronic device ED through one more picking-up and placement processes.

Figure 3:
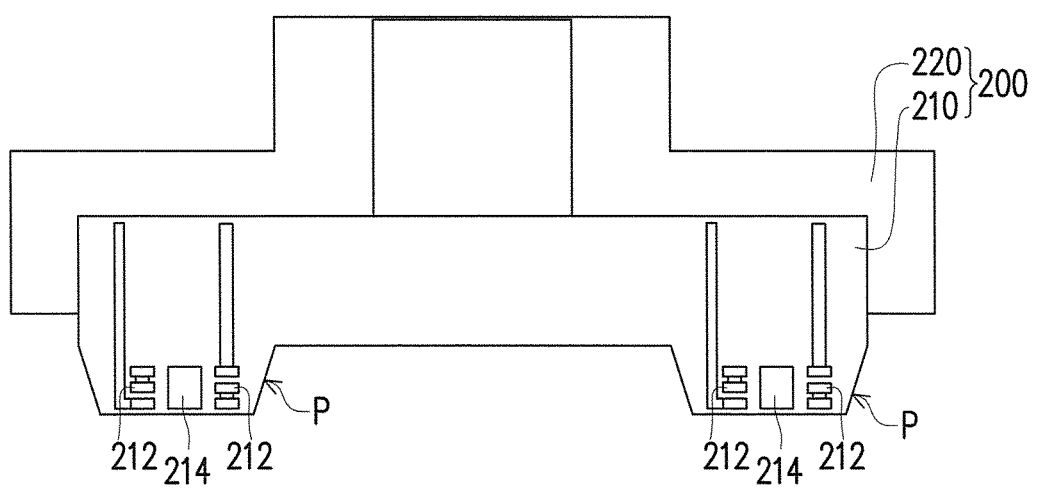
FIG. 3 is a cross-sectional view of the electric-programmable magnetic module of this disclosure.

FIG. 3 is a cross-sectional view of the electric-programmable magnetic module of this disclosure. Referring to FIG. 3, the electric-programmable magnetic module 200 comprises a micro electro mechanical system (MEMS) chip 210 and a bonding equipment 220 is provided. The MEMS chip 210 comprises a plurality of electromagnetic coils 212 and each of the electromagnetic coils 212 is individually controlled by corresponding control lines. Specifically, each of the electromagnetic coils 212 is electrically connected to a pair of control lines intersected with each other and is enabled or disabled through the pair of control lines. Accordingly, the electromagnetic coils 212 are electrically addressable. The MEMS chip 210 is assembled with and carried by the bonding equipment 220. In this embodiment, the bonding equipment 220 is, for example, a currently used flip-chip bonder. In other words, the MEMS chip 210 of the electric-programmable magnetic module 200 is compatible with currently used flip chip bonder. In this embodiment, the MEMS chip 210 may further include a plurality of ferromagnetic metal elements 214, wherein each ferromagnetic metal element 214 is optional disposed in a space surrounded by one of the electromagnetic coils 212, respectively. For example, the material of the ferromagnetic metal elements 214 is nickel (Ni), ferronickel alloy or other suitable ferromagnetic metals having high permeability.

As shown in FIG. 3, the MEMs chip 210 comprises a plurality of protrusions P arranged in array, the protrusion P are suitable for contacting a plurality of electronic devices ED arranged on a first substrate S1, and each of the electromagnetic coils 212 and the ferromagnetic metal element 214 surrounded thereby are located in one of the protrusions P, respectively. Each of the electromagnetic coils 212 comprises a multi-layered electromagnetic coil. Furthermore, an arrangement pitch of the electromagnetic coils 212 ranges from 1 micro-meter to 100 micro-meters, for example. It is noted that the electromagnetic coils 212 are arranged regularly and the arrangement pitch of the electromagnetic coils 212 is, for example, constant or not constant. For example, the average arrangement pitch of the electromagnetic coils 212 is P1, the arrangement pitch of the electronic devices ED disposed on the first substrate S1 is P2, and P1=N×P2, wherein N is an positive integer. An area (i.e. coverage) of each of the protrusions P is greater than or equal to an area (i.e. dimension) of each of the electronic devices ED so as to prevent the electronic devices ED from suffering stress during picking-up and placement. In other words, when the protrusions P are aligned with the electronic devices ED, the electronic devices ED are entirely covered by the protrusions P. Based on actual design requirements, the area (i.e. coverage) of each of the protrusions P may be smaller than the area (i.e. dimension) of each of the electronic devices ED, for example.

The MEMS chip 210 comprising the electromagnetic coils 212 and the ferromagnetic metal element 214 is fabricated by semiconductor process. The fabrication process of the MEMS chip 210 is described in detail in accompanying with FIG. 4A through FIG. 4E.

Figure 4A:
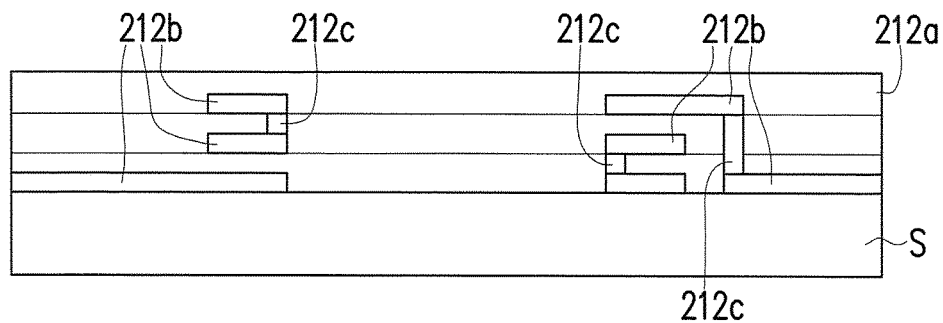
FIG. 4A through FIG. 4E schematically illustrate cross-sectional views of fabrication process of the MEMS chip in accordance with this disclosure.
Figure 4A:
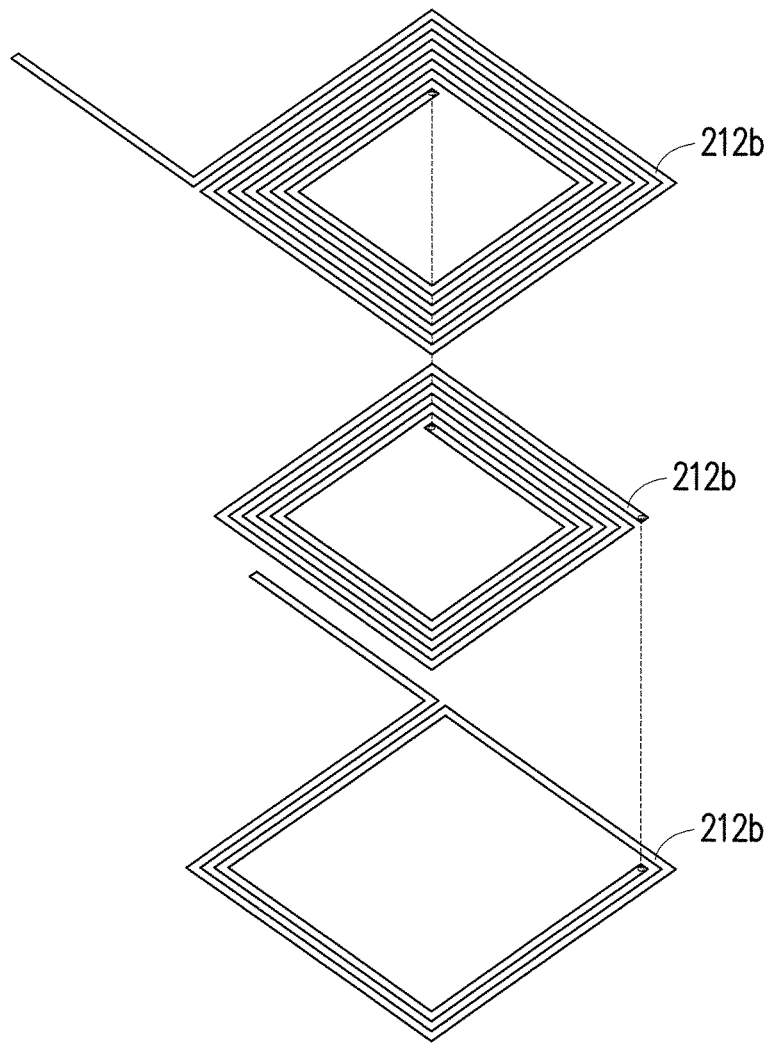

FIG. 4A through FIG. 4E schematically illustrate cross-sectional views of fabrication process of the MEMS chip in accordance with this disclosure. Referring to FIG. 4A, a substrate S is provided and the above-mentioned electromagnetic coils 212 are formed on the substrate S (only one electromagnetic coil 212 is shown in FIG. 4A through FIG. 4E for illustration). For example, the electromagnetic coils 212 comprises at least one dielectric film 212a, at least one conductive film 212b and a plurality of conductive vias 212c, wherein the dielectric film 212a and the conductive film 212b are stacked on the substrate S alternately, and the conductive vias 212c are formed in the dielectric film 212a and electrically connect the adjacent conductive film 212b. In other words, the electromagnetic coils 212 are so-call vertical-stacked electromagnetic coils. The three dimensional electromagnetic coils formed by the conductive film 212b and the conductive vias 212c has a spiral-shaped structure, as shown in FIG. 4A'. The dielectric film 212a, conductive film 212b and the conductive vias 212c are, for example, formed by film deposition, photolithography and etch processes. The conductive film 212b and the conductive vias 212c constitute the coil portions of the electromagnetic coils 212 and are formed by materials with high conductivity. The dielectric film 212a protects the coil portions from short circuit. The number of the conductive film(s) 212b is 1, 2, 3 or more while the number of the dielectric film(s) 212a is 1, 2, 3 or more.

Figure 4B:
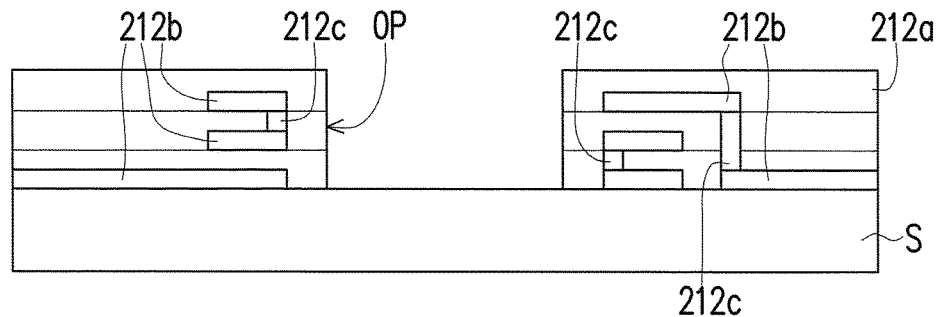
Figure 4C:
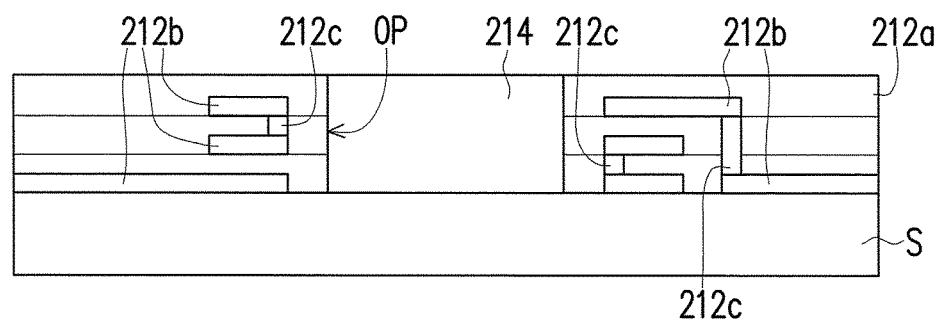

Referring to FIG. 4B and FIG. 4C, a portion of the dielectric film 212a is removed such that a plurality of openings OP surrounded by the conductive film 212b of the corresponding electromagnetic coils 212 are formed (only one opening OP is shown in FIG. 4B and FIG. 4C for illustration). For example, the substrate S is exposed by the openings OP. However, the disclosure is not limited thereto. Then, the ferromagnetic metal elements 214 are formed in the openings OP. The ferromagnetic metal elements 214 are formed by high permeability (μr) materials. The ferromagnetic metal elements 214 are formed by nickel (Ni), nickel-iron alloy or other suitable ferromagnetic metals having high permeability.

Figure 4D:
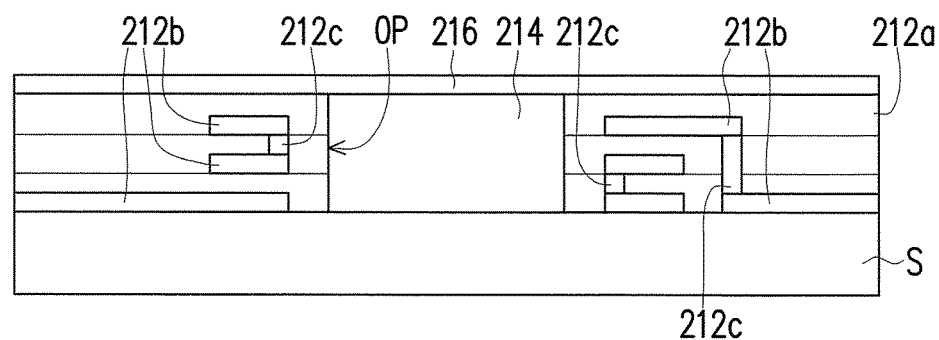
Figure 4E:
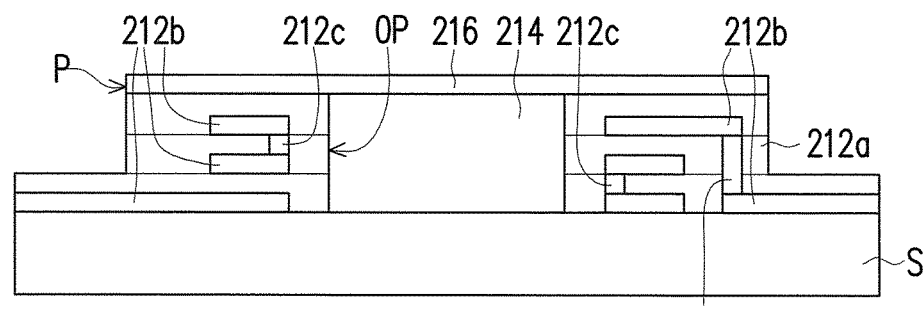

Referring to FIG. 4D and FIG. 4E, after the ferromagnetic metal elements 214 are formed, a cap dielectric layer 216 is further formed to cover the electromagnetic coils 212 and the ferromagnetic metal elements 214. Then, the cap dielectric layer 216 and the dielectric films 212a are patterned such that the protrusions P of the MEMS chip 210 are formed and the fabrication of the MEMS chip 210 is accomplished. In this embodiment, the material of the cap dielectric layer 216 is silicon oxide, silicon nitride or other non-conductive polymers, for example.

Second Embodiment

Figure 5:
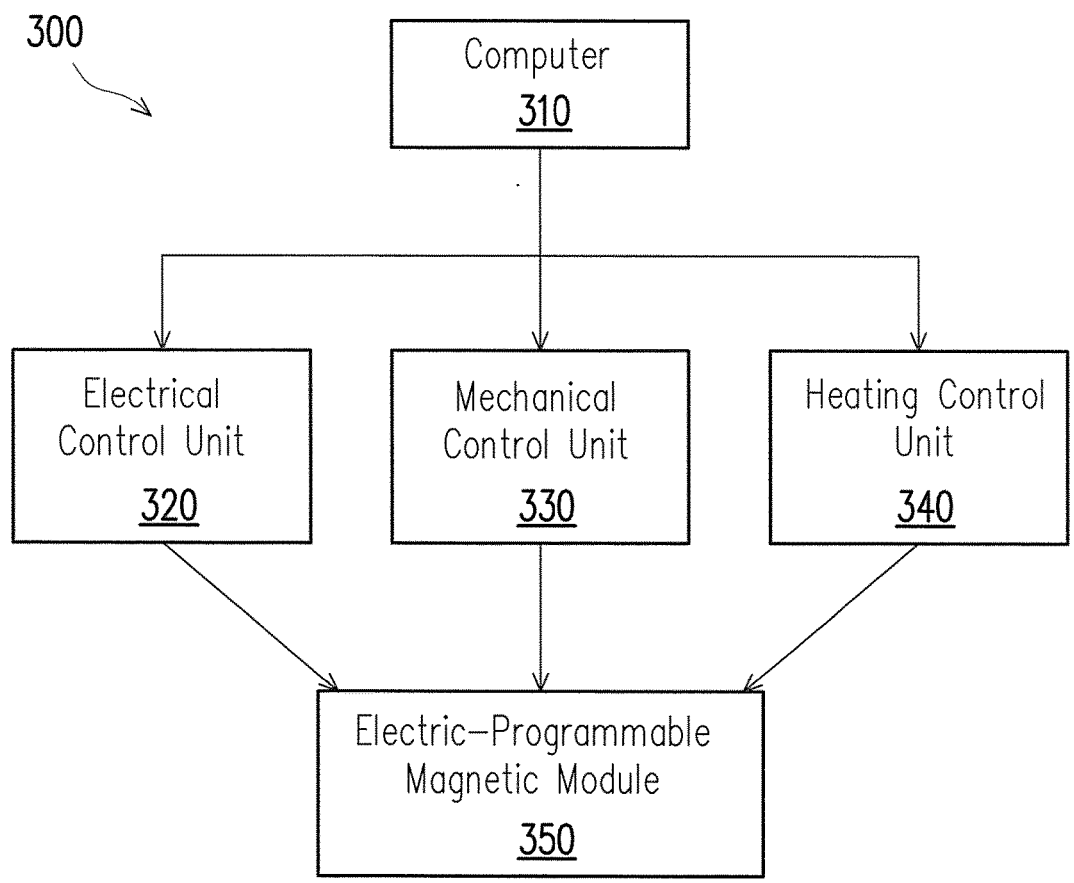
FIG. 5 is a block diagram of a control system for the electric-programmable magnetic module shown in FIG. 3.

FIG. 5 is a block diagram of a control system for the electric-programmable magnetic module shown in FIG. 3. Referring to FIG. 5, the control system 300 of this embodiment includes a computer 310, an electrical control unit 320, a mechanical control unit 330 and a heating control unit 340, wherein the electrical control unit 320, the mechanical control unit 330 and the heating control unit 340 are electrically connected to the computer 310. For example, the computer 310 and the electrical control unit 320 control operation of the MEMS chip 210 (e.g. selectively pick-up, in-situ testing). The computer 310 and the mechanical control unit 330 control movement of the bonding equipment 220 (shown in FIG. 3). The computer 310 and the heating control unit 340 control parameters of the heating process during the picking-up and placement process.

Third Embodiment

FIG. 6A through FIG. 6K are cross-sectional views of a picking-up and placement process for electronic devices in accordance with the third embodiment of the disclosure.

Figure 6A:
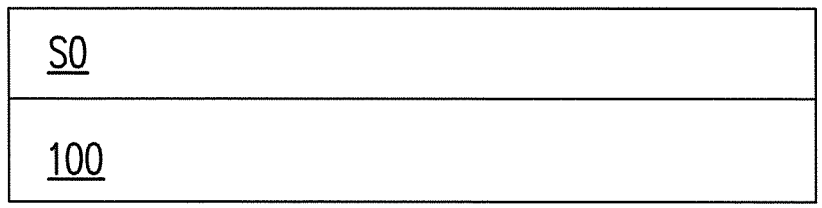
FIG. 6A through FIG. 6K are cross-sectional views of a picking-up and placement process for electronic devices in accordance with the third embodiment of the disclosure.
Figure 6B:
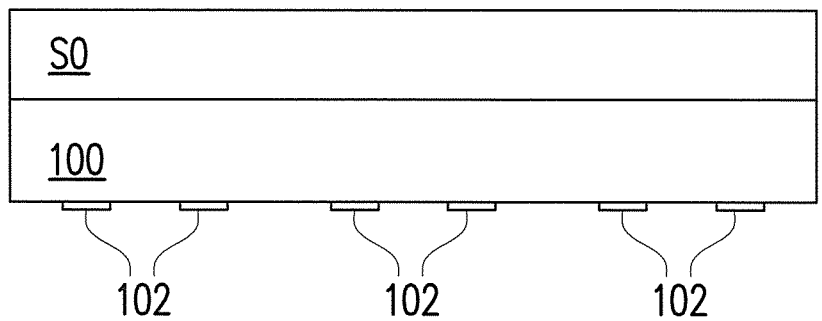
Figure 6C:
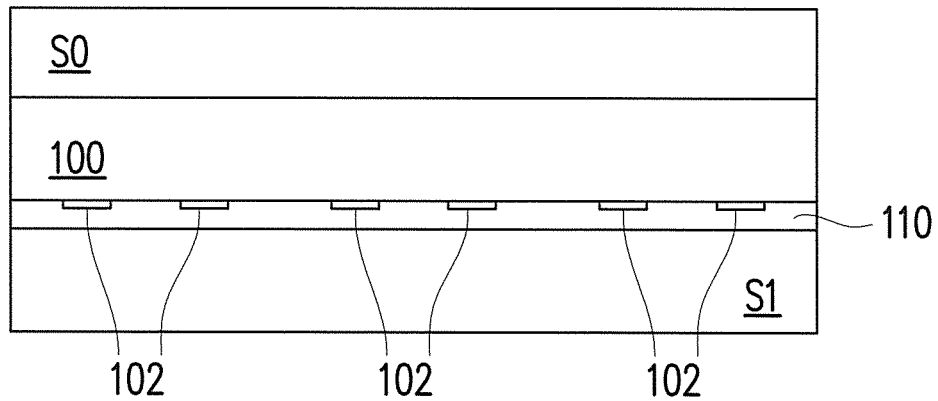
Figure 6D:
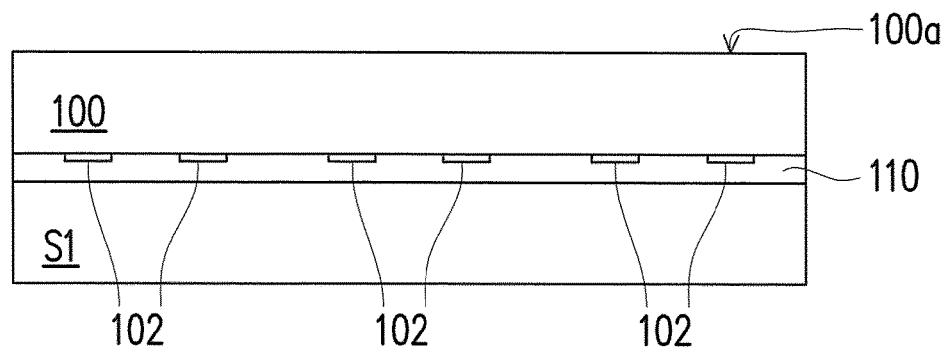
Figure 6E:
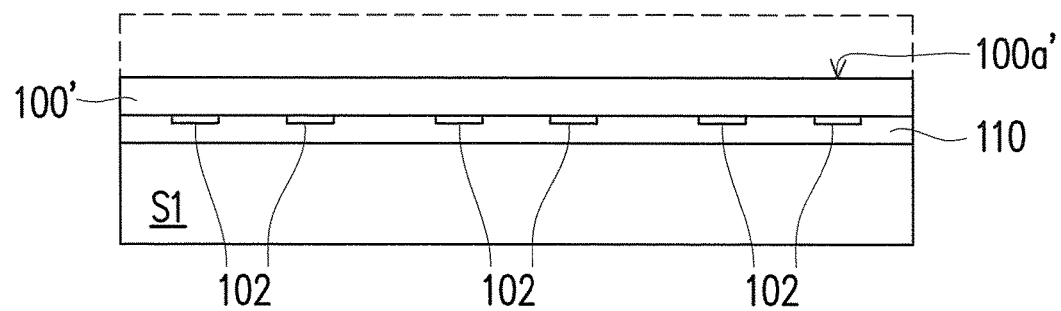
Figure 6F:
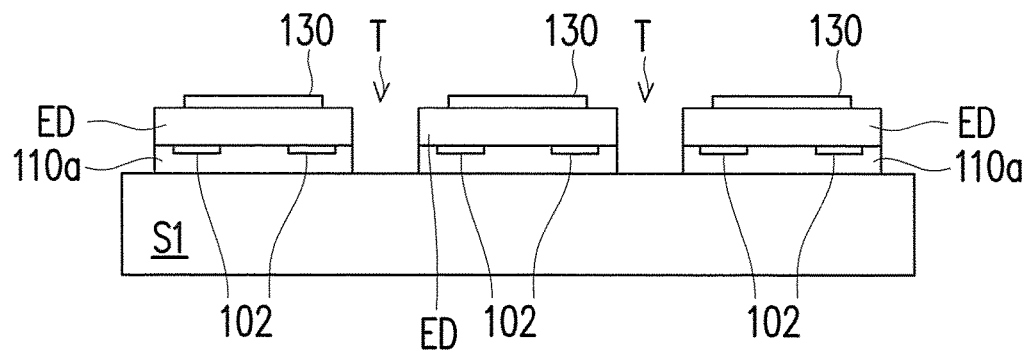
Figure 6G:
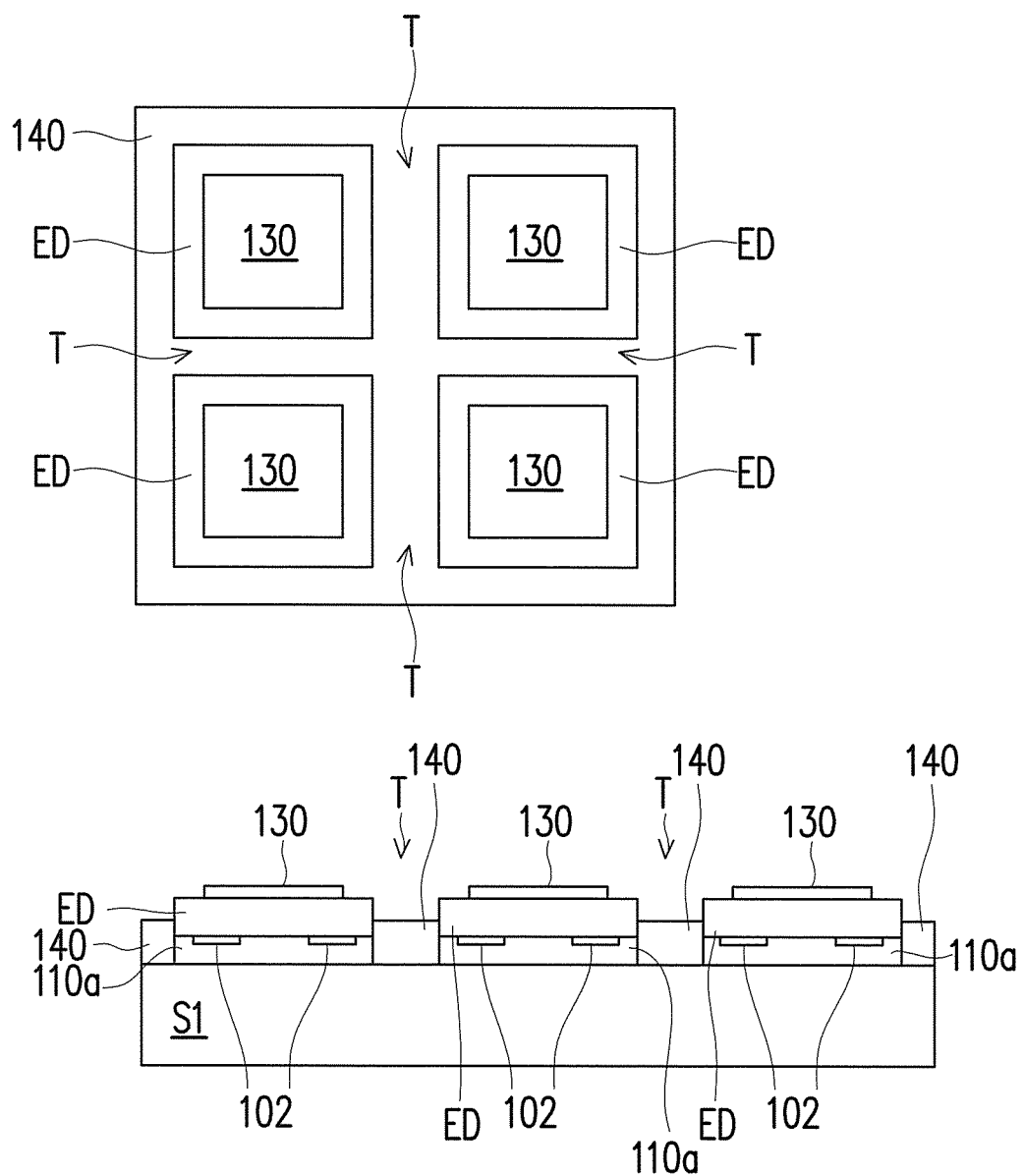
Figure 6H:
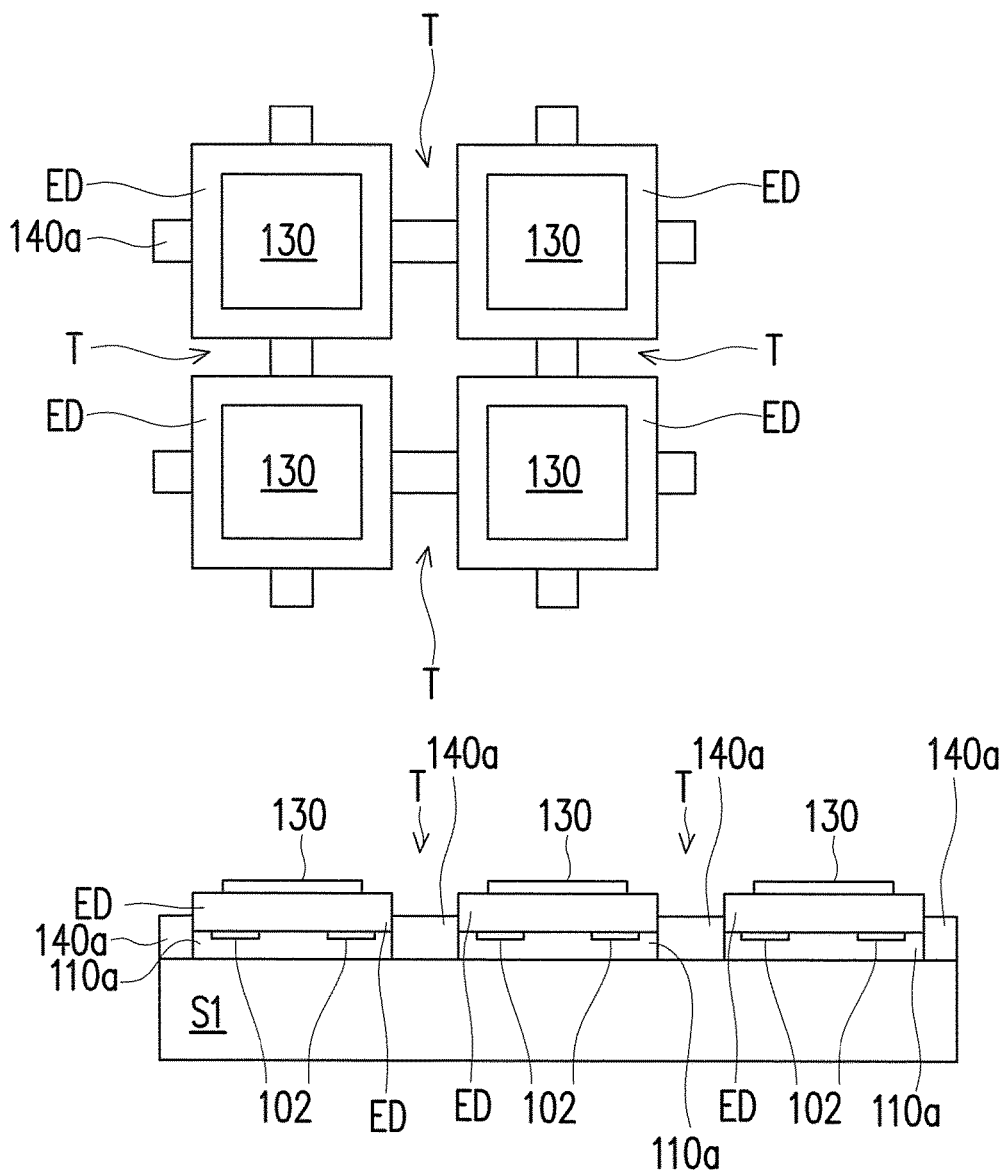
Figure 6I:
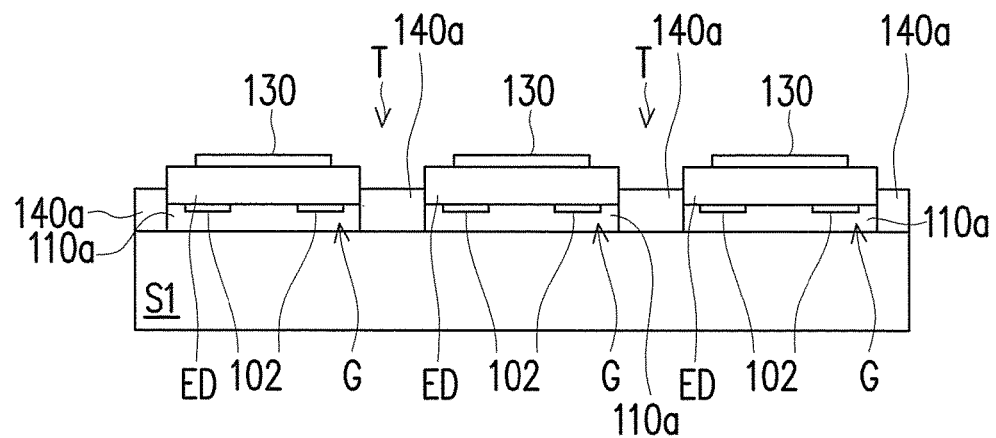
Figure 6J:
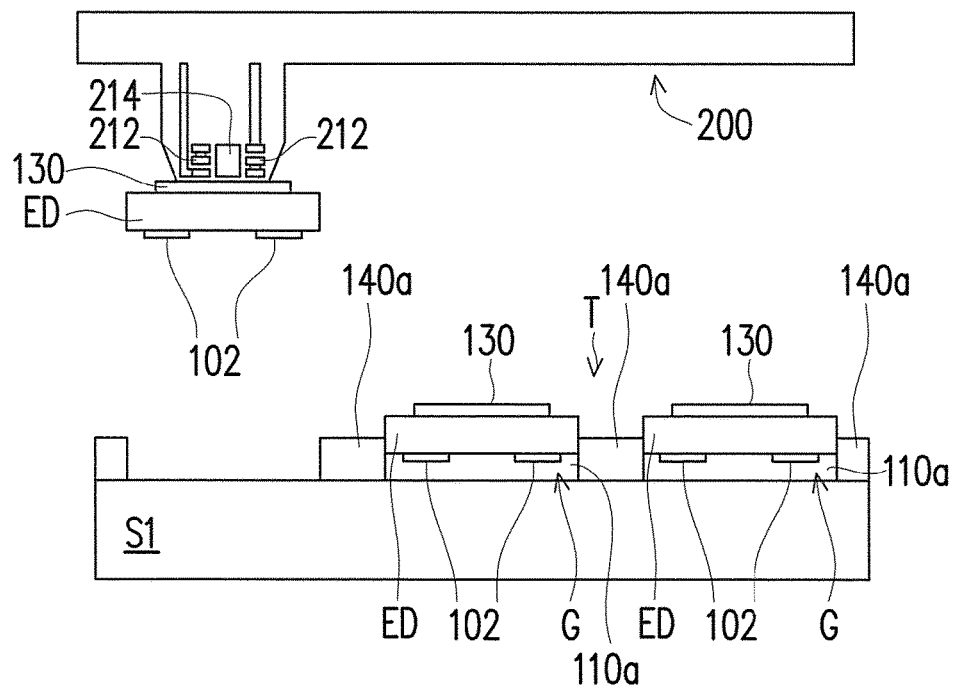
Figure 6K:
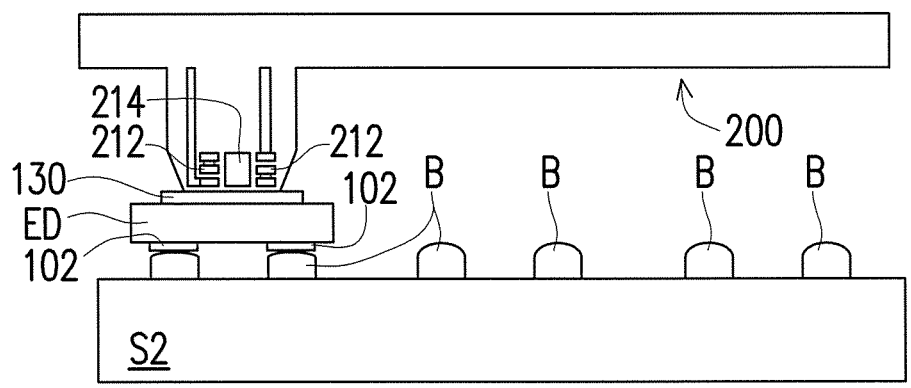

Referring to FIG. 6A through FIG. 6K, the picking-up and placement process for electronic devices in accordance with this embodiment is similar with the picking-up and placement process of the first embodiment except that the sacrificial layer 120 disclosed in the first embodiment is omitted in this embodiment. Specifically, after the photoelectric semiconductor layer 100 is bonded with the first substrate S1 through the adhesive 110, since the electrodes 102 are magnetic electrodes, no sacrificial layer (120) and magnetic portions (130) are required to be formed on the surface 100a of the photoelectric semiconductor layer 100 and the photoelectric semiconductor layer 100 and the adhesive 110 are patterned to form the electronic devices ED and a plurality of adhesive patterns 110a disposed under the electronic devices ED (as shown in FIG. 6F). After the electronic devices ED are formed, the sequential processes shown FIG. 6G through FIG. 6K are substantially the same with those shown in FIG. 2I through FIG. 2M.

In the aforesaid embodiments of this disclosure, since the picking-up and placement process can handle relatively small electronic devices (e.g. less than 100 micro-meters) through magnetic force, the bottleneck of fabricating the monolithic micro-displays can be easily resolved. Furthermore, since the MEMS chip of the electric-programmable magnetic module is compatible with currently used flip chip bonder, it is easy to introduce such electric-programmable magnetic module into flip chip bonding process to place and bond electronic devices more efficiently.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. An electric-programmable magnetic module, comprising:

a micro electro mechanical system (MEMS) chip comprising a plurality of electromagnetic coils, each of the electromagnetic coils being individually controlled; and a bonding equipment, wherein the MEMS chip is assembled with and carried by the bonding equipment, wherein the MEMS chip further comprises a plurality of protrusions arranged in array, the protrusions are suitable for contacting a plurality of electronic devices arranged on a first substrate, and each of the electromagnetic coils is located in one of the protrusions respectively.

2. The electric-programmable magnetic module according to claim 1, wherein a coverage of each of the protrusions is greater than or equal to a dimension of each of the electronic devices.

3. The electric-programmable magnetic module according to claim 1, wherein a first arrangement pitch of the protrusions is P1 and a second arrangement pitch of the electronic devices disposed on the first substrate is P2, where P1=N× P2, and N is an positive integer.

4. The electric-programmable magnetic module according to claim 1, wherein the MEMS chip further comprises a plurality of ferromagnetic metal elements and each of the ferromagnetic metal elements is disposed in a space surrounded by one of the electromagnetic coils.

5. The electric-programmable magnetic module according to claim 4, further comprising a cap dielectric layer, wherein the cap dielectric layer covers the electromagnetic coils and the ferromagnetic metal elements.

6. The electric-programmable magnetic module according to claim 1, wherein each of the electromagnetic coils comprises a multi-layered electromagnetic coil.

7. The electric-programmable magnetic module according to claim 1, wherein an arrangement pitch of the electromagnetic coils ranges from 1 micro-meter to 100 micro-meters.

\* \* \* \* \*